(12) United States Patent
Kang et al.

(10) Patent No.: US 9,806,133 B2
(45) Date of Patent: Oct. 31, 2017

(54) ORGANIC LIGHT EMITTING DIODE DISPLAY

(71) Applicant: Samsung Display Co., Ltd., Yongin-si, Gyeonggi-do (KR)

(72) Inventors: Nam Su Kang, Seoul (KR); Ji-Hye Shim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/228,762

(22) Filed: Aug. 4, 2016

(65) Prior Publication Data

US 2017/0117332 A1    Apr. 27, 2017

(30) Foreign Application Priority Data

Oct. 27, 2015  (KR) .................. 10-2015-0149204

(51) Int. Cl.
*H01L 51/00* (2006.01)
*H01L 21/00* (2006.01)
*H01L 27/32* (2006.01)
*H01L 51/52* (2006.01)

(52) U.S. Cl.
CPC ........ *H01L 27/3213* (2013.01); *H01L 27/322* (2013.01); *H01L 27/3262* (2013.01); *H01L 51/5203* (2013.01); *H01L 51/5256* (2013.01); *H01L 51/5275* (2013.01)

(58) Field of Classification Search
CPC ............... H01L 27/3211; H01L 27/322; H01L 27/3262; H01L 51/5256
See application file for complete search history.

(56) References Cited

U.S. PATENT DOCUMENTS

| | | | |
|---|---|---|---|
| 9,000,458 B2 | 4/2015 | Seo et al. | |
| 9,466,816 B2* | 10/2016 | Kang | H01L 51/5271 |
| 2012/0193816 A1* | 8/2012 | Schmid | H01L 51/107 |
| | | | 257/787 |
| 2012/0273822 A1 | 11/2012 | Ohsawa et al. | |
| 2014/0070195 A1* | 3/2014 | Choi | H01L 51/5256 |
| | | | 257/40 |
| 2014/0353635 A1 | 12/2014 | Chou et al. | |
| 2015/0029724 A1 | 1/2015 | Shiratori et al. | |
| 2015/0060811 A1 | 3/2015 | Shiratori | |
| 2015/0263311 A1* | 9/2015 | Park | H01L 51/5256 |
| | | | 257/40 |
| 2016/0155979 A1* | 6/2016 | Yim | H01L 51/5281 |
| | | | 257/40 |

FOREIGN PATENT DOCUMENTS

| | | |
|---|---|---|
| KR | 10-2011-0019195 A | 2/2011 |
| KR | 10-2011-0057673 A | 6/2011 |
| KR | 10-2013-0076400 A | 7/2013 |
| KR | 10-2015-0040529 A | 4/2015 |

* cited by examiner

*Primary Examiner* — Alonzo Chambliss
(74) *Attorney, Agent, or Firm* — Lewis Roca Rothgerber Christie LLP

(57) ABSTRACT

An organic light emitting diode (OLED) display includes a substrate, a thin film transistor (TFT) on the substrate, an OLED connected to the TFT and configured to emit white light, and a capping layer on the OLED. The capping layer includes a first high refractive index layer, a first low refractive index layer, a second high refractive index layer, and a second low refractive index layer that are sequentially stacked.

18 Claims, 9 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0149204, filed in the Korean Intellectual Property Office on Oct. 27, 2015, the entire content of which is incorporated herein by reference.

BACKGROUND

1. Technical Field

Aspects of embodiments of the present invention relate to an organic light emitting diode (OLED) display.

2. Description of the Related Art

An OLED display may include two electrodes and an organic emission layer interposed therebetween. Electrons injected from one electrode and holes injected from the other electrode may be combined in the organic emission layer to generate excitons, and the generated excitons may release energy to emit light. The OLED display may display set or predetermined images by using the emitted light. Put another way, the OLED display may include OLEDs, each of which may include an anode, a cathode, and an organic emission layer disposed between the anode and the cathode. The organic emission layer may emit white light through a plurality of stacked emission layers, and different colors may be expressed by disposing different color filters at corresponding locations at which the emitted light passes through.

The above information disclosed in this Background section is only to enhance the understanding of the background of the invention and therefore it may contain information that does not form the prior art that is already known in this country to a person of ordinary skill in the art.

SUMMARY

Aspects of embodiments of the present invention provide for an OLED display. Further aspects are directed to an OLED display whose OLEDs express white light, and to improving light emitting efficiency and adjustability of corresponding color coordinates in such a display.

According to an embodiment of the present invention, an organic light emitting diode (OLED) display is provided. The OLED display includes a substrate, a thin film transistor (TFT) on the substrate, an OLED connected to the TFT and configured to emit white light, and a capping layer on the OLED. The capping layer includes a first high refractive index layer, a first low refractive index layer, a second high refractive index layer, and a second low refractive index layer that are sequentially stacked.

The OLED display may further include filler on the capping layer and a color filter on the filler.

The filler may have a refractive index between about 1.4 and about 1.6.

A refractive index of the first high refractive index layer may be greater than the refractive index of the filler.

The refractive index of the first high refractive index layer may be about 0.3 or more greater than the refractive index of the filler.

A refractive index of the first low refractive index layer may be smaller than the refractive index of the first high refractive index layer.

The refractive index of the first low refractive index layer may be about 0.45 or more smaller than the refractive index of the first high refractive index layer.

A refractive index of the second low refractive index layer may be smaller than the refractive index of the filler.

The refractive index of the second low refractive index layer may be about 0.15 or more smaller than the refractive index of the filler.

A refractive index of the second high refractive index layer may be greater than the refractive index of the second low refractive index layer.

The capping layer may further include a thickness adjustment layer between the first low refractive index layer and the second high refractive index layer.

A thickness of the thickness adjustment layer may be less than a sum of thicknesses of the first high refractive index layer, the first low refractive index layer, the second high refractive index layer, and the second low refractive index layer.

A refractive index of the thickness adjustment layer may be smaller than or equal to of the refractive index of the first high refractive index layer, and greater than or equal to that the refractive index of the second low refractive index layer.

The OLED may include a first electrode connected to the TFT, a light-emitting member on the first electrode, and a second electrode on the light-emitting member. The capping layer may be on the second electrode.

The light-emitting member may include a plurality of light-emitting units.

Each of the light-emitting units may be configured to emit one of red light, blue light, green light, yellow light, and orange light.

The plurality of light-emitting units may include three light-emitting units. Two of the three light-emitting units may be configured to emit a same color light, and another of the three light-emitting units be configured to emit a different color light.

The plurality of light-emitting units may include three light-emitting units. The three light-emitting units may be configured to emit different colors from each other.

According to the above and other embodiments of the present invention, it is possible to provide an OLED display whose OLEDs may express white light having improved light emitting efficiency and adjustability of corresponding color coordinates.

DETAILED DESCRIPTION

Figure 1:
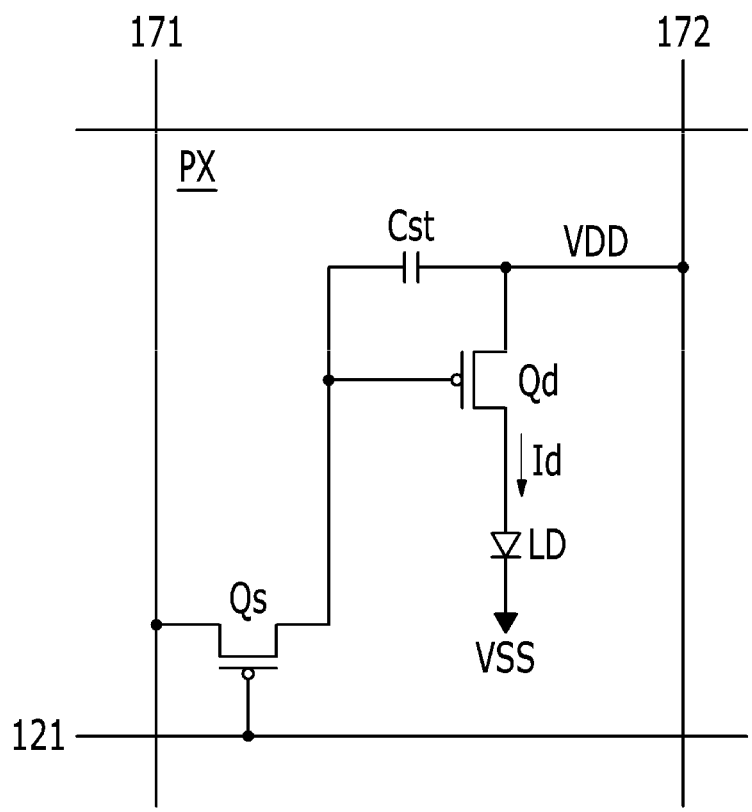
FIG. 1 is an equivalent circuit diagram of an example pixel of an OLED display according to an embodiment of the present invention.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

To more clearly describe embodiments of the present invention, parts that are irrelevant to the description may be omitted, and like numerals refer to like or similar constituent elements throughout the specification. Further, in the drawings, the size and thickness of each element are arbitrarily illustrated for ease of description, and the present invention is not necessarily limited to those sizes and thicknesses illustrated in the drawings.

For example, in the drawings, the thicknesses of layers, films, panels, regions, etc., may be exaggerated for clarity or ease of description. It will be understood that when an element such as a layer, film, region, or substrate, is referred to as being "on" another element, it may be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, in the specification, the word "on" may mean positioned above or below the object portion, and does not necessarily mean positioned on the upper side of the object portion based on a gravitational direction. Furthermore, throughout the specification, the phrase "on a plane" means viewing a target portion from the top, and the phrase "on a cross-section" means viewing a cross-section formed by vertically cutting a target portion from the side.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed. An example OLED display according to an embodiment of the present invention will now be described with reference to FIGS. 1 to 4.

Figure 2:
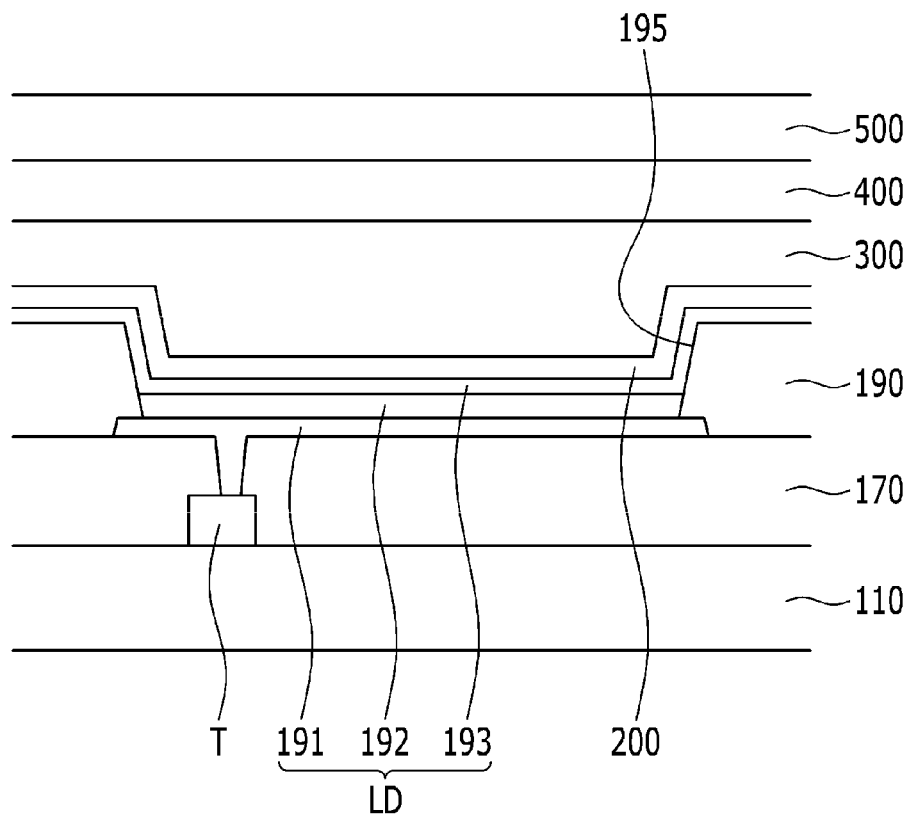
FIG. 2 is a schematic cross-sectional view of an example OLED display according to an embodiment of the present invention.

FIG. 1 is an equivalent circuit diagram of an example pixel PX of an OLED display according to an embodiment of the present invention. FIG. 2 is a schematic cross-sectional view of an example OLED display according to an embodiment of the present invention.

Referring to FIG. 1, the OLED display may include a plurality of signal lines 121, 171, and 172, and the pixel PX that may be connected to the signal lines 121, 171, and 172. Further, the OLED display may include a plurality of such signal lines 121 arranged in a first direction, a plurality of such signal lines 171 and a plurality of such signal lines 172 arranged in a second direction crossing the first direction, and a plurality of such pixels PX arranged in an approximate matrix form at corresponding crossing regions of the signal lines 121, 171, and 172.

The signal lines 121, 171, and 172 may include gate lines 121 for transmitting gate signals (or scan signals), data lines 171 for transmitting data signals, and driving voltage lines 172 for transmitting a driving voltage VDD. The gate lines 121 may substantially extend in a row direction and may be parallel or nearly parallel to each other, and the data lines 171 and the driving voltage lines 172 may substantially extend in a column direction and may be parallel or nearly parallel to each other.

The pixel PX may include a switching thin film transistor (TFT) Qs, a driving TFT Qd, a storage capacitor Cst, and an OLED LD. The switching TFT Qs may be provided with a control terminal, an input terminal, and an output terminal. The control terminal may be connected to the gate line 121, the input terminal may be connected to the data line 171, and the output terminal may be connected to the driving TFT Qd. The switching TFT Qs may transmit the data signal being applied to the data line 171 to the driving TFT Qd in response to the gate signal being applied to the gate line 121.

The driving TFT Qd may also be provided with a control terminal, an input terminal, and an output terminal. The control terminal may be connected to the switching TFT Qs, the input terminal may be connected to the driving voltage line 172, and the output terminal may be connected to the OLED LD. The driving TFT Qd may output an output current Id, a magnitude of which varies depending on a voltage applied between the control terminal and the output terminal.

The storage capacitor Cst may be connected between the control and input terminals of the driving TFT Qd. The storage capacitor Cst may be charged by the data signal being applied to the control terminal of the driving TFT Qd, and may maintain the data signal even after the switching TFT Qs is turned off.

The OLED LD is provided with an anode connected to the output terminal of the driving TFT Qd and a cathode connected to a common voltage Vss. The OLEDs LD may collectively display images by emitting light, the corresponding intensities of which vary depending on the output currents Id of the corresponding driving TFTs Qd.

The switching TFT Qs and the driving TFT Qd may be, for example, n-channel electric field effect transistors (FETs) or p-channel electric FETs. In addition, in other embodiments, the switching and driving TFTs Qs and Qd, the storage capacitor Cst, and the OLED LD may be variously connected.

Referring to FIG. 2, the OLED display may include a first substrate 110, a TFT T disposed on the first substrate 110, an insulating layer 170, an OLED LD, a pixel defining layer 190, a capping layer 200, filler 300, a color filter 400, and a second substrate 500. The TFT T may be disposed on the first substrate 110, and the insulating layer 170 may cover the TFT T and be disposed on an entire surface of the first substrate 110. The TFT T may be a driving TFT.

The OLED LD and the pixel defining layer 190 may be disposed on the insulating layer 170. The OLED LD may include a first electrode 191, a second electrode 193, and a light-emitting member 192 disposed between the first electrode 191 and the second electrode 193. The OLED LD may emit light depending on a driving signal transmitted from the TFT T.

The first electrode 191 may be an anode of the OLED LD for injecting holes, and the second electrode 193 may be a cathode of the OLED LD for injecting electrons. However, the present invention is not limited thereto, and in other embodiments, the first electrode 191 may be the cathode and the second electrode 193 may be the anode.

The first electrode 191 may be a reflecting electrode and the second electrode 193 may be a transparent electrode. The first electrode 191 may be made, for example, of at least one of magnesium (Mg), silver (Ag), gold (Au), calcium (Ca), lithium (Li), chromium (Cr), and aluminum (Al), or a combination thereof. The second electrode 193 may be made, for example, of indium tin oxide (In—Sn—O, ITO), indium gallium oxide (In—Ga—O, IGO), indium zinc oxide (In—Zn—O, IZO), or a combination thereof, and may further include, for example, a thin layer of one or more of a silver-magnesium (Ag—Mg) alloy, a silver-lithium (Ag—Li) alloy, silver (Ag), magnesium (Mg), and calcium (Ca).

The pixel defining layer 190 may include an opening 195 and may be disposed on an edge portion of the first electrode 191 and the insulating layer 170. However, the present invention is not limited thereto, and in other embodiments, the pixel defining layer 190 may be disposed on the insulating layer 170 and may be spaced apart from the first electrode 191.

The first electrode 191 may be disposed in the opening 195 of the pixel defining layer 190, and the light-emitting member 192 (that may emit white light) may be disposed on the first electrode 191 in the opening 195 of the pixel defining layer 190. The second electrode 193 may be disposed on the light-emitting member 192 and the pixel defining layer 190.

The capping layer 200 may be disposed on the second electrode 193. The capping layer 200 may serve to protect the OLED LD while allowing light emitted from the light-emitting member 192 to be efficiency outputted to the outside.

The filler 300 may be disposed on the capping layer 200. The filler 300 may have a refractive index between about 1.4 and about 1.6, and may improve structural strength and durability of the OLED display. Herein, terms such as "about" are intended to be used as approximations, whose more precise values (e.g., variations such as 5% or 10% from the stated value) would be appreciated by one of ordinary skill in the described technology.

The color filter 400 may be disposed on the filler 300. The color filter 400 may be, for example, a red color filter, a green color filter, a blue color filter, or a white color filter. Any color may be expressed using white light emitted from the light-emitting member 192 passing through an appropriately colored one of the color filters 400.

The second substrate 500 may be disposed on the color filter 400. The second substrate 500 may be bonded to the first substrate 110 by a sealant (for example, at peripheral portions of the OLED display) to function as an encapsulation substrate. Example structures of the light-emitting member 192 and the capping layer 200 according to the embodiments of the present invention will be described with reference to FIGS. 3 and 4.

Figure 3:
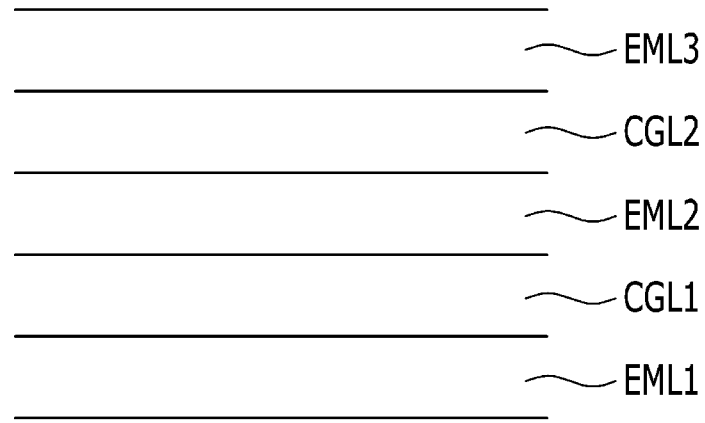
FIG. 3 is a schematic cross-sectional view of an example emission layer (or light-emitting member) of the OLED display of FIG. 2 according to an embodiment of the present invention.
Figure 4:
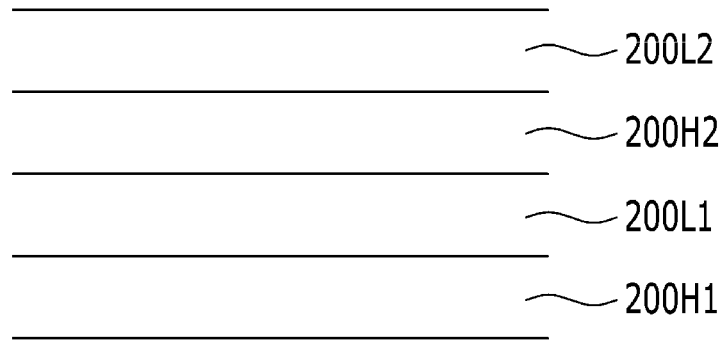
FIG. 4 is a schematic cross-sectional view of an example capping layer of the OLED display of FIG. 2 according to an embodiment of the present invention.

FIG. 3 is a schematic cross-sectional view of an example emission layer (or light-emitting member) 192 of the OLED display of FIG. 2 according to an embodiment of the present invention. FIG. 4 is a schematic cross-sectional view of an example capping layer 200 of the OLED display of FIG. 2 according to an embodiment of the present invention.

The light-emitting member 192 may include a first light-emitting unit EML1 (such as an organic light-emitting unit), a second light-emitting unit EML2, and a third light-emitting unit EML3 that are sequentially stacked. For example, the first light-emitting unit EML1 may be disposed on the first electrode 191. In addition, the light-emitting member 192 may further include a first charge generation layer CGL1 disposed between the first light-emitting unit EML1 and the second light-emitting unit EML2, and a second charge generation layer CGL2 disposed between the second light-emitting unit EML2 and the third light-emitting unit EML3.

Two of the first light-emitting unit EML1, the second light-emitting unit EML2, and the third light-emitting unit EML3 may emit the same color, while the remaining one may emit a different color, and the light-emitting member 192 may collectively emit white light by combining light respectively emitted from the light-emitting units EML1, EML2, and EML3. For example, the first light-emitting unit EML1, the second light-emitting unit EML2, and the third light-emitting unit EML3 may each emit one of red light, blue light, green light, yellow light, and orange light. However, the present invention is not limited thereto, and the first light-emitting unit EML1, the second light-emitting unit EML2, and the third light-emitting unit EML3 may respectively emit different colors, while white light may be emitted by combining the light emitted from the light-emitting units EML1, EML2, and EML3.

The first charge generation layer CGL1 and the second charge generation layer CGL2 may be layers that generate electron-hole pairs, and the generated holes may be transmitted to one light-emitting unit and the generated electrons may be transmitted to another light-emitting unit. For example, in FIG. 3, when the first electrode 191 is the anode and the second electrode 193 is the cathode, the electrons being generated at the first charge generation layer CGL1 may be transmitted to the first light-emitting unit EML1 and the holes being generated thereat may be transmitted to the second light-emitting unit EML2.

In a similar fashion, the electrons being generated at the second charge generation layer CGL2 may be transmitted to the second light-emitting unit EML2 and the holes being generated thereat may be transmitted to the third light-emitting unit EML3. Electron efficiency may be improved due to the first charge generation layer CGL1 and the second charge generation layer CGL2, which may increase the lifespan of the OLED LD.

While the light-emitting member 192 may include the three light-emitting units EML1, EML2, and EML3 as illustrated in FIG. 3, the present invention is not limited thereto, and in other embodiments, the light-emitting member 192 may include two light-emitting units emitting different colors and a charge generation layer disposed between the two light-emitting units. Each of the light-emitting units (such as organic light-emitting units) may emit, for example, one of red, blue, green, yellow, and orange colors.

The first light-emitting unit EML1, the second light-emitting unit EML2, and the third light-emitting unit EML3 may each be formed as multiple layers that may include at least one of an organic emission layer, a hole injection layer (HIL), a hole transporting layer (HTL), an electron transporting layer (ETL), and an electron injection layer (EIL). When the first light-emitting unit EML1 includes all of the aforementioned layers, the hole injection layer may be disposed on the first electrode 191 (which may be an anode), and then the hole transporting layer, the organic emission layer, the electron transporting layer, and the electron injection layer may be sequentially stacked on the hole injection layer.

In a similar fashion, when the second light-emitting unit EML2 includes all of the aforementioned layers, the hole injection layer may be disposed on the first charge generation layer CGL1, and then the hole transporting layer, the organic emission layer, the electron transporting layer, and the electron injection layer may be sequentially stacked on the hole injection layer. In addition, when the third light-emitting unit EML3 includes all of the aforementioned layers, the hole injection layer may be disposed on the second charge generation layer CGL2, and then the hole transporting layer, the organic emission layer, the electron transporting layer, and the electron injection layer may be sequentially stacked on the hole injection layer.

Referring to FIG. 4, the capping layer 200 may include a first high refractive index layer 200H1, a first low refractive index layer 200L1, a second high refractive index layer 200H2, and a second low refractive index layer 200L2 that are sequentially stacked. For example, the first high refractive index layer 200H1 may be disposed on the second electrode 193. Here, the first high refractive index layer 200H1 and the second low refractive index layer 200L2 may serve to improve efficiency of white light emitted from the light-emitting member 192 while the first low refractive index layer 200L1 and the second high refractive index layer 200H2 may serve to adjust hue of the white light emitted from the light-emitting member 192.

The first high refractive index layer 200H1 may have a greater refractive index than the filler 300, which in some embodiments may have a refractive index of between about 1.4 and about 1.6. For example, the first high refractive index layer 200H1 may have a greater refractive index by about 0.3 or more than that of the filler 300. The first high refractive index layer 200H1 may be made, for example, of at least one of a titanium oxide (TiOx), a tungsten oxide (WOx), molybdenum oxide $MoO_3$, cerium oxide (CeO), cadmium oxide (CdO), copper oxide (CuO), gallium oxide ($Ga_2O_3$), and zinc oxide (ZnO) in such combination as to achieve the desired refractive index discussed above, as would be apparent to one of ordinary skill.

The first low refractive index layer 200L1 may have a smaller refractive index than that of the first high refractive index layer 200H1. In some embodiments, the first low refractive index layer 200L1 may have a smaller refractive index by about 0.45 or more than that of the first high refractive index layer 200H1. The first low refractive index layer 200L1 may be made, for example, of at least one of BAlq (bis-(8-hydroxy-2-methylquinoline)-(4-phenylphenoxy)aluminum), lithium fluoride (LiF), $Alq_3$ (tris-(8-hyroxyquinoline)aluminum), Liq (8-hydroxyquinolatolithium), lithium oxide ($Li_2O$), and magnesium oxide (MgO) in such combination as to achieve the desired refractive index discussed above, as would be apparent to one of ordinary skill.

The second low refractive index layer 200L2 may have a smaller refractive index than that of the filler 300, which in some embodiments may have a refractive index of between about 1.4 and about 1.6. In some embodiments, the second low refractive index layer 200L2 may have a smaller refractive index by about 0.15 or more than that of the filler 300. The second low refractive index layer 200L2 may be made, for example, of BAlq (bis-(8-hydroxy-2-methylquinoline)-(4-phenylphenoxy)aluminum), lithium fluoride (LiF), $Alq_3$ (tris-(8-hyroxyquinoline)aluminum), Liq (8-hydroxyquinolatolithium), lithium oxide ($Li_2O$), and magnesium oxide (MgO) in such combination as to achieve the desired refractive index discussed above, as would be apparent to one of ordinary skill.

The second high refractive index layer 200H2 may have a greater refractive index than that of the second low refractive index layer 200L2. The second high refractive index layer 200H2 may be made, for example of at least one of a titanium oxide (TiOx), a tungsten oxide (WOx), molybdenum oxide ($MoO_3$), cerium oxide (CeO), cadmium oxide (CdO), copper oxide (CuO), gallium oxide ($Ga_2O_3$), and zinc oxide (ZnO) in such combination as to achieve the desired refractive index discussed above, as would be apparent to one of ordinary skill.

Due to the refractive index differences between the first high refractive index layer 200H1, the first low refractive index layer 200L1, the second high refractive index layer 200H2, and the second low refractive index layer 200L2 of the capping layer 200, some of the white light emitted from the OLED LD may transmit through the capping layer 200, and some of the white light may be reflected by the capping layer 200. For example, the white light may be reflected at an interface between the first high refractive index layer 200H1 and the first low refractive index layer 200L1, at an interface between the first low refractive index layer 200L1 and the second high refractive index layer 200H2, at an interface between the second high refractive index layer 200H2 and the second low refractive index layer 200L2, or at an interface between the filler 300 and the second low refractive index layer 200L2.

The light reflected due to the capping layer 200 may again be reflected by the first electrode 191 and this process repeated, thereby amplifying the light. In addition, reflection of the light may be repeated inside the capping layer 200, thereby amplifying the light. For example, the reflection thereof may be repeated at the interface between the first high refractive index layer 200H1 and the first low refractive index layer 200L1, at the interface between the first low refractive index layer 200L1 and the second high refractive index layer 200H2, at the interface between the second high refractive index layer 200H2 and the second low refractive index layer 200L2, or at the interface between the filler 300 and the second low refractive index layer 200L2.

The OLED display may effectively amplify the light through such a resonance effect, thereby improving the light emitting efficiency. Further, desired color coordinates may be easily adjusted through the structure of the capping layer 200, as described below and as would be apparent to one of ordinary skill. Light emitting efficiency improvement and improved color coordinate adjustment for OLED displays in which such capping layers 200 are formed will be described with reference to FIGS. 5 and 6.

Figure 5:
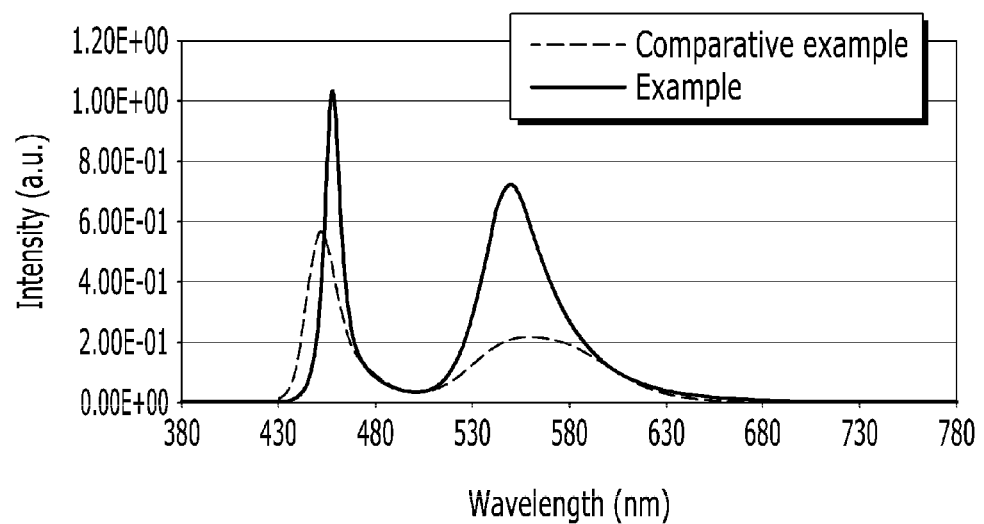
FIG. 5 is a graph illustrating a relationship between light intensity and light wavelength of both an example OLED display according to an embodiment of the present invention and a comparable OLED display.

FIG. 5 is a graph illustrating a relationship between light intensity and light wavelength of both an OLED display according to an embodiment of the present invention and a comparable OLED display.

The OLED display embodiment may be formed with a light-emitting member 192 in which a blue light-emitting unit EML1, a yellow light-emitting unit EML2, and another blue light-emitting unit ELM3 are sequentially stacked to emit white light, and a capping layer 200 according to FIG. 4, e.g., in which a first high refractive index layer 200H1, a first low refractive index layer 200L1, a second high refractive index layer 200H2, and a second low refractive index layer 200L2 are sequentially stacked. For example, the second electrode 193 may be made of an Ag—Mg alloy and a thickness thereof be about 60 Å, the first high refractive index layer 200H1 may be made of a WOx and a thickness thereof be about 55 Å, the first low refractive index layer 200L1 may be made of LiF and a thickness thereof be about 60 Å, the second high refractive index layer 200H2 may be made of a TiOx and a thickness thereof be about 55 Å, and the second low refractive index layer 200L2 may be made of Liq and a thickness thereof be about 55 Å.

A comparable OLED display may have a structure in which a blue light-emitting unit, a yellow light-emitting unit, and a blue light-emitting unit are sequentially stacked to emit white light, and which further has a capping layer formed as a single layer.

Referring to FIG. 5, it can be seen that the intensity of the blue light and the yellow light of the OLED display embodiment is greater than that of the comparable OLED display. Therefore, it can be seen that the light emitting efficiency of the OLED display embodiment is improved compared to the comparable OLED display.

Figure 6:
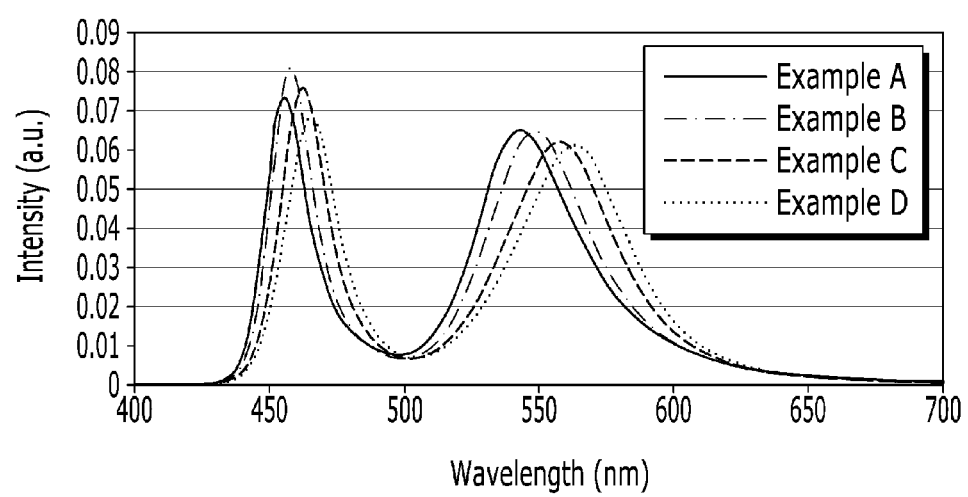
FIG. 6 is a graph and corresponding white color coordinate adjustment table illustrating a relationship between light intensity and light wavelength of example OLED display according to four embodiments of the present invention.

FIG. 6 is a graph and corresponding white color coordinate adjustment table illustrating a relationship between light intensity and light wavelength of an example OLED display according to four embodiments of the present invention.

The OLED display may be formed with a light-emitting member 192 in which a blue light-emitting unit EML1, a yellow light-emitting unit EML2, and a blue light-emitting EML3 unit are sequentially stacked to emit white light, and a capping layer 200 according to FIG. 4, e.g., in which a first high refractive index layer 200H1, a first low refractive index layer 200L1, a second high refractive index layer 200H2, and a second low refractive index layer 200L2 are sequentially laminated.

For example, the second electrode 193 may be made of an Ag—Mg alloy and a thickness thereof be about 60 Å, the first high refractive index layer 200H1 may be made of a WOx and a thickness thereof be about 55 Å, the second high refractive index layer 200H2 may be made of a TiOx and a thickness thereof be about 40 Å, and the second low refractive index layer 200L2 may be made of Liq and a thickness thereof be about 65 Å.

In addition, the first low refractive index layer 200L1 may be made of LiF and a thickness thereof be different according to Example Embodiments A, B, C, and D. The thickness of the first low refractive index layer 200L1 of Embodiment A may be about 30 Å, the thickness of the first low refractive index layer 200L1 of Embodiment B may be about 50 Å, the thickness of the first low refractive index layer 200L1 of Embodiment C may be about 70 Å, and the thickness of the first low refractive index layer 200L1 of Embodiment D may be about 90 Å.

Referring to FIG. 6, it can be seen that spectrums vary according to Embodiments A, B, C, and D, and the corresponding white light color coordinates are changed. As such, it can be seen that the color coordinates may be adjusted to desired white color coordinates by adjusting the thickness of the first low refractive index layer, 200L1. The thickness of the first low refractive index layer 200L1 may thus be adjusted to form different embodiments, but the present invention is not limited thereto. In other embodiments, for example, it may be possible to adjust the color coordinates to desired white color coordinates by adjusting the thickness of a different layer.

In other embodiments, the capping layer 200 of the OLED display may have a structure that is different from that of the capping layer 200 of FIG. 4. A capping layer 200 according to another embodiment of the present invention will be described with reference to FIG. 7.

Figure 7:
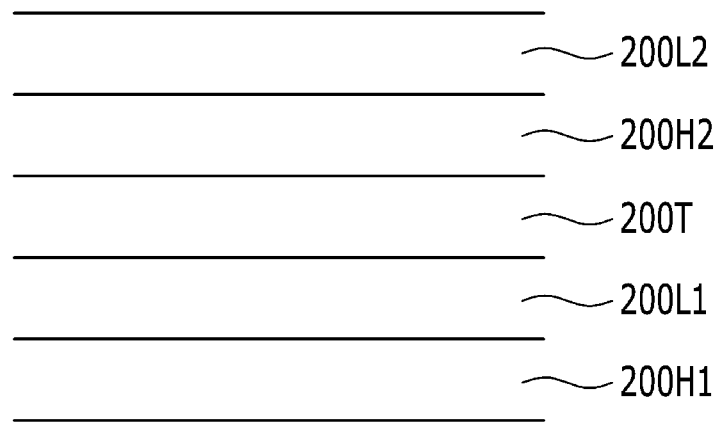
FIG. 7 is a schematic cross-sectional view of an example capping layer according to another embodiment of the present invention.

FIG. 7 is a schematic cross-sectional view of an example capping layer 200 according to another embodiment of the present invention.

Referring to FIG. 7, the capping layer 200 may have a thickness adjustment layer 200T for adjusting an optical compensation thickness. In further detail, the capping layer 200 of FIG. 7 may include a first high refractive index layer 200H1, a first low refractive index layer 200L1, the thickness adjustment layer 200T, a second high refractive index layer 200H2, and a second low refractive index layer 200L2 that are sequentially stacked. The first high refractive index layer 200H1, the first low refractive index layer 200L1, the second high refractive index layer 200H2, and the second low refractive index layer 200L2 may be substantially the same as those of the capping layer 200 of FIG. 4.

The thickness of the thickness adjustment layer 200T may be less than or equal to the sum of the thicknesses of the first high refractive index layer 200H1, the first low refractive index layer 200L1, the second high refractive index layer 200H2, and the second low refractive index layer 200L2. In addition, the refractive index of the thickness adjustment layer 200T may be the same as that of the first high refractive index layer 200H1 or the second low refractive index layer 200L2, or may be between the refractive indices of the first high refractive index layer 200H1 and the second low refractive index layer 200L2. The thickness adjustment layer 200T may be made, for example, of one or more of barium chloride (BaCl), -beryllium oxide (BeO), cesium fluoride (CeF$_3$), germanium oxide (GeO), and spinel (MgAl$_2$O$_4$).

In the capping layer 200 of FIG. 7, the thickness adjustment layer 200T may be formed as a single layer, but the present invention is not limited thereto, and in other embodiments, the thickness adjustment layer 200T may include a plurality of layers. For example, the sum of the thicknesses of the plurality of layers may be less than or equal to the sum of the thicknesses of the first high refractive index layer 200H1, the first low refractive index layer 200L1, the second high refractive index layer 200H2, and the second low refractive index layer 200L2. In addition, the refractive index of each of the plurality of layers may be the same as that of the first high refractive index layer 200H1 or the second low refractive index layer 200L2, or may be between the refractive indices of the first high refractive index layer 200H1 and the second low refractive index layer 200L2.

The structure of an example OLED display according to another embodiment of the present invention will be described more fully with reference to FIGS. 8 and 9.

Figure 8:
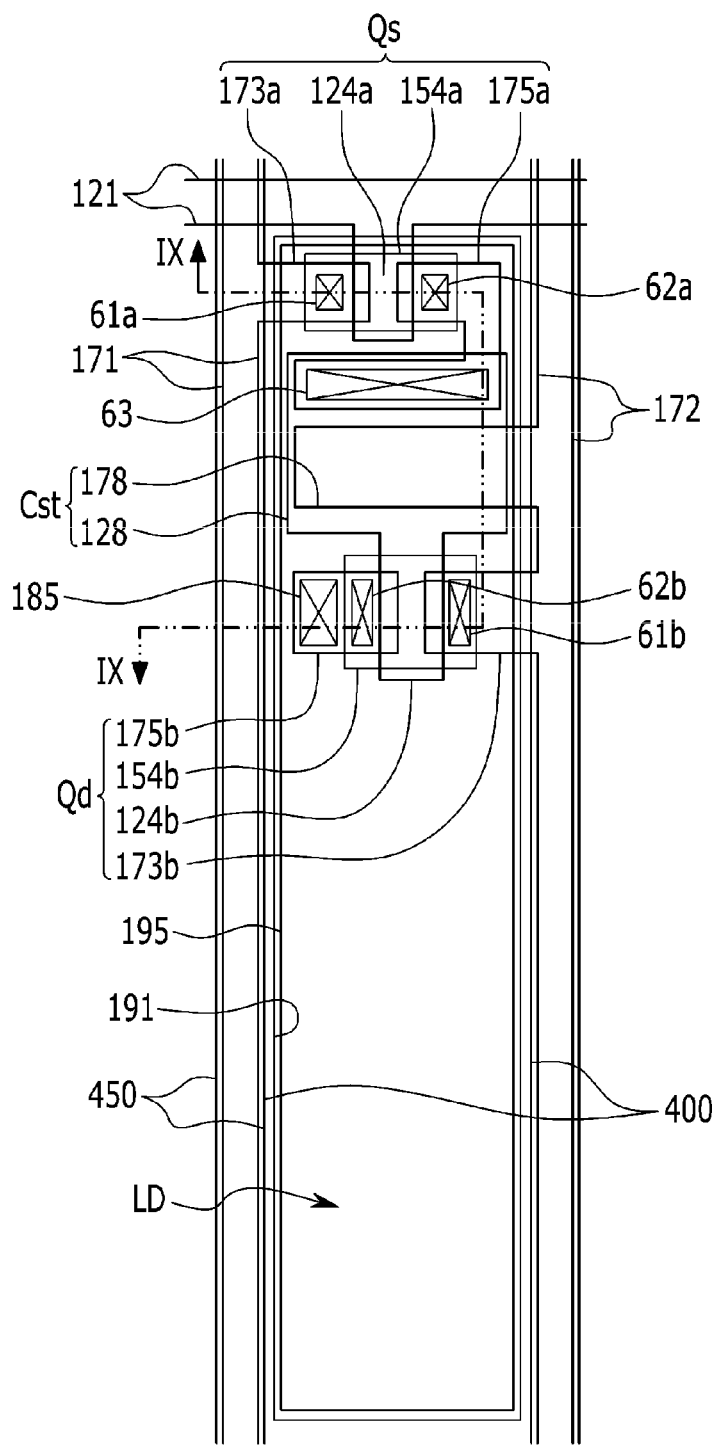
FIG. 8 is a layout view of an example pixel of an OLED display according to an embodiment of the present invention.

FIG. 8 is a layout view of an example pixel of an OLED display according to an embodiment of the present invention. FIG. 9 is an example cross-sectional view of the OLED display of FIG. 8 taken along line IX-IX according to an embodiment of the present invention.

Figure 9:
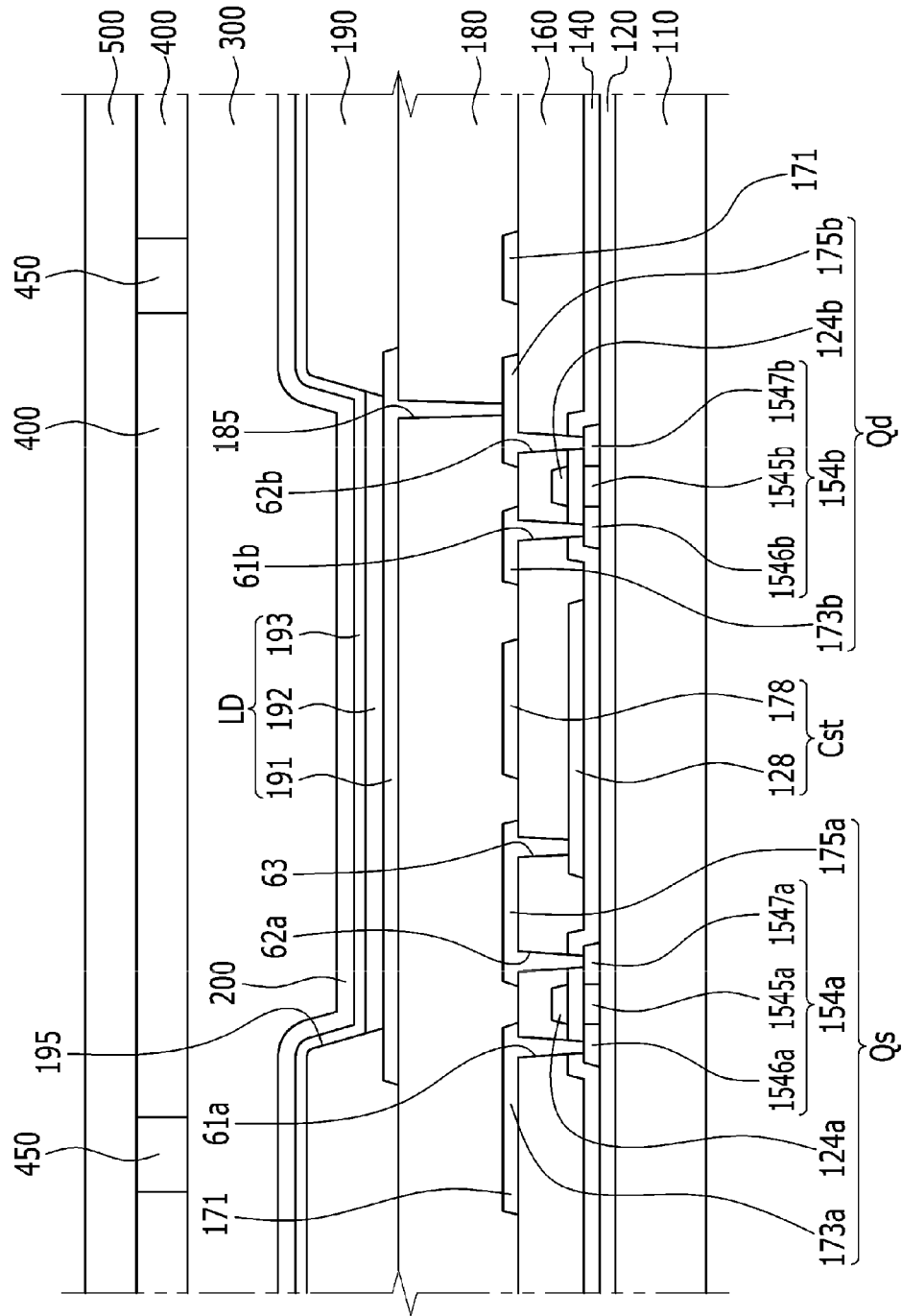
FIG. 9 is an example cross-sectional view of the OLED display of FIG. 8 taken along line IX-IX according to an embodiment of the present invention.

Referring to FIGS. 8 and 9, in the OLED display, a plurality of thin film structural elements may be disposed on a first substrate 110. Hereinafter, the plurality of thin film structural elements will be described in further detail.

A buffer layer 120 may be disposed on the first substrate 110. The first substrate 110 may be, for example, a transparent insulating substrate that is made of glass, quartz, ceramic, or plastic. Further, the first substrate 110 may be a metallic substrate made of stainless steel or the like.

The buffer layer 120 may be formed as a single layer of a silicon nitride (SiNx) or as a dual-layer in which a silicon nitride (SiNx) and a silicon oxide (SiOx) are stacked. The buffer layer 120 may serve to flatten a surface while preventing permeation of unnecessary materials such as impurities or moisture. The buffer layer 120 may be omitted according to a kind of the first substrate 110 and a processing condition thereof.

A switching semiconductor layer 154a and a driving semiconductor layer 154b may be disposed on the buffer layer 120 and be spaced apart from each other. The switching semiconductor layer 154a may be made of polycrystalline silicon, and may include a switching channel region 1545a, a switching source region 1546a, and a switching drain region 1547a. The driving semiconductor layer 154b may be made of polycrystalline silicon, and may include a driving channel region 1545b, a driving source region 1546b, and a driving drain region 1547b. The switching source region 1546a and the switching drain region 1547a may be disposed at opposite sides of the switching channel region 1545a, and the driving source region 1546b and the driving drain region 1547b may be disposed at opposite sides of the driving channel region 1545b.

The switching and driving channel regions 1545a and 1545b may be made of polycrystalline silicone that is not doped with an impurity, i.e., an intrinsic semiconductor, and the switching and driving source regions 1546a and 1546b and the switching and driving drain regions 1547a and the 1547b may be made of polycrystalline silicon that is doped with a conductive impurity, i.e., an impurity semiconductor.

A gate insulating layer 140 may be disposed on the buffer layer 120, the switching semiconductor layer 154a, and the driving semiconductor layer 154b. The gate insulating layer 140 may be a single layer or multiple layers including at least one of a silicon nitride and a silicon oxide.

A gate line 121 and a first storage capacitive plate 128 may be disposed on the gate insulating layer 140. The gate line 121 may extend in a horizontal direction to transmit the gate signal, and may include a switching gate electrode 124a that protrudes from the gate line 121 to the switching semiconductor layer 154a. The switching gate electrode 124a may overlap the switching channel region 1545a.

The first storage capacitive plate 128 may include a driving gate electrode 124b that protrudes from the first storage capacitive plate 128 to the driving semiconductor layer 154b. The driving gate electrode 124b may overlap the driving channel region 1545b.

An interlayer insulating layer 160 may be disposed on the gate line 121, the first storage capacitive plate 128, and the buffer layer 120. The interlayer insulating layer 160 may be a single layer or multiple layers including at least one of a silicon nitride and a silicon oxide.

The interlayer insulating layer 160 and the gate insulating layer 140 may be provided with a switching source exposure hole 61a and a switching drain exposure hole 62a through which the switching source region 1546a and the switching drain region 1547a are respectively exposed. Further, the interlayer insulating layer 160 and the gate insulating layer 140 may be provided with a driving source exposure hole 61b and a driving drain exposure hole 62b through which the driving source region 1546b and the driving drain region 1547b are respectively exposed. In addition, the interlayer insulating layer 160 may be provided with a first contact hole 63 through which a portion of the first storage capacitive plate 128 is exposed.

A data line 171, a driving voltage line 172, a switching drain electrode 175a, and a driving drain electrode 175b may be disposed on the interlayer insulating layer 160. The data line 171 may extend in a direction crossing the gate line 121 and may include a switching source electrode 173a that transmits the data signal and protrudes toward the switching semiconductor layer 154a from the data line 171.

The driving voltage line 172 may transmit the driving voltage, be separated from the data line 171, and extend in the same direction as the data line 171. The driving voltage line 172 may include a driving source electrode 173b that protrudes toward the driving semiconductor layer 154b from the driving voltage line 172, and a second storage capacitive plate 178 that protrudes from the driving voltage line 172 to overlap the first storage capacitive plate 128. The first storage capacitive plate 128 and the second storage capacitive plate 178 may form the storage capacitor Cst by using the interlayer insulating layer 160 as a dielectric material.

The switching drain electrode 175a may face the switching source electrode 173a, and the driving drain electrode 175b may face the driving source electrode 173b. The switching source electrode 173a and the switching drain electrode 175a may be respectively connected to the switching source region 1546a and the switching drain region 1547a through the switching source exposure hole 61a and the switching drain exposure hole 62a. Further, the switching drain electrode 175a may be electrically connected to the first storage capacitive plate 128 and the driving gate electrode 124b through the first contact hole 63 that extends to be formed in the interlayer insulating layer 160.

The driving source electrode 173b and the driving drain electrode 175b may be respectively connected to the driving source region 1546b and the driving drain region 1547b through the driving source exposure hole 61b and the driving drain exposure hole 62b. The switching semiconductor layer 154a, the switching gate electrode 124a, the switching source electrode 173a, and the switching drain electrode 175a may form the switching TFT Qs, and the driving semiconductor layer 154b, the driving gate electrode 124b, the driving source electrode 173b, and the driving drain electrode 175b may form the driving TFT Qd.

A planarization layer 180 may be disposed on the interlayer insulating layer 160, the data line 171, the driving voltage line 172, the switching drain electrode 175a, and the driving drain electrode 175b. The planarization layer 180 may be made of an organic material, and an upper surface thereof may be flattened. The planarization layer 180 may be provided with a second contact hole 185 through which the driving drain electrode 175b is exposed.

An OLED LD and a pixel defining layer 190 may be disposed on the planarization layer 180. The OLED LD may include a first electrode 191, a light-emitting member 192, and a second electrode 193.

The first electrode 191 may be disposed on the planarization layer 180 and be electrically connected to the driving drain electrode 175b of the driving TFT Qd through the second contact hole 185 formed in the planarization layer 180. The first electrode 191 may be an anode of the OLED LD. The first electrode 191 may be a reflecting electrode, and may include, for example, at least one of magnesium (Mg), silver (Ag), gold (Au), calcium (Ca), lithium (Li), chromium (Cr), and aluminum (Al), or an alloy thereof.

The pixel defining layer 190 may include the opening 195, and be disposed on the planarization layer 180 (or the insulating layer 170 as shown in FIG. 2) and the edge portion of the first electrode 191. The pixel defining layer 190 is not limited thereto, and in other embodiments, it may be disposed on the planarization layer 180 or the insulating layer 170 and be spaced apart from the first electrode 191.

The first electrode 191 may be disposed in the opening 195 of the pixel defining layer 190, and the light-emitting member 192 may emit white light and be disposed on the first electrode 191 in the opening 195 of the pixel defining layer 190. The light-emitting member 192, as shown in FIG. 3, may include a plurality of light-emitting units and a plurality of charge generation layers, and it may emit white light by combining the light emitted from the plurality of light-emitting units.

The second electrode 193 may be disposed on the light-emitting member 192 and the pixel defining layer 190. The second electrode 193 may be a transparent electrode, and may be made, for example, of indium tin oxide (In—Sn—O, ITO), indium gallium oxide (In—Ga—O, IGO), indium zinc oxide (In—Zn—O, IZO), or a combination thereof, and may further be made, for example, with one or more of a thin layer of a silver-magnesium (Ag—Mg) alloy, a silver-lithium (Ag—Li) alloy, silver (Ag), magnesium (Mg), or calcium (Ca). The second electrode 193 may become a cathode of the OLED LD.

A capping layer 200 may be disposed on the second electrode 193. The capping layer 200, as shown in FIG. 4, may include a plurality of layers.

Filler 300 may be disposed on the capping layer 200. The filler 300 may have a refractive index between about 1.4 and about 1.6, and may serve to improve structural strength and durability of the OLED display.

A color filter 400 and a light blocking layer 450 may be disposed on the filler 300. The light blocking layer 450 may overlap the data line 171, and the color filter 400 be disposed between the light blocking layers 450. The color filter 400 may be, for example, a red color filter, a green color filter, a blue color filter, or a white color filter. Each color may be displayed by white light emitted from the light-emitting member 192 passing through a corresponding one of the color filters 400.

A second substrate 500 may be disposed on the color filter 400 and the light blocking layer 450. The second substrate 500 may be bonded to the first substrate 110 by a sealant to function as an encapsulation substrate.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS

| | |
|---|---|
| 110: first substrate | 121: gate line |
| 124a: switching gate electrode | 124b: driving gate electrode |
| 128: first storage capacitive plate | 140: gate insulating layer |
| 154a: switching semiconductor layer | 154b: driving semiconductor layer |
| 170: insulating layer | |
| 171: data line | 172: driving voltage line |
| 173a: switching source electrode | 173b: driving source electrode |
| 175a: switching drain electrode | 175b: driving drain electrode |
| 178: second storage capacitive plate | 180: planarization layer |
| 190: pixel defining layer | 191: first electrode |
| 192: light-emitting member | 193: second electrode |
| 200: capping layer | 300: filler |
| 400: color filter | 450: light blocking layer |
| 500: second substrate | |

What is claimed is:

1. An organic light emitting diode (OLED) display, comprising:
    a substrate;
    a thin film transistor (TFT) on the substrate;
    an OLED connected to the TFT and configured to emit white light; and
    a capping layer on the OLED,
    wherein the capping layer comprises a first high refractive index layer, a first low refractive index layer, a second high refractive index layer, and a second low refractive index layer that are sequentially stacked.

2. The OLED display of claim 1, further comprising:
    filler on the capping layer; and
    a color filter on the filler.

3. The OLED display of claim 2, wherein the filler has a refractive index between about 1.4 and about 1.6.

4. The OLED display of claim 3, wherein a refractive index of the first high refractive index layer is greater than the refractive index of the filler.

5. The OLED display of claim 4, wherein the refractive index of the first high refractive index layer is about 0.3 or more greater than the refractive of the filler.

6. The OLED display of claim 5, wherein a refractive index of the first low refractive index layer is smaller than the refractive index of the first high refractive index layer.

7. The OLED display of claim 6, wherein the refractive index of the first low refractive index layer is about 0.45 or more smaller than the refractive index of the first high refractive index layer.

8. The OLED display of claim 7, wherein a refractive index of the second low refractive index layer is smaller than the refractive index of the filler.

9. The OLED display of claim 8, wherein the refractive index of the second low refractive index layer is about 0.15 or more smaller than the refractive index of the filler.

10. The OLED display of claim 9, wherein a refractive index of the second high refractive index layer is greater than the refractive index of the second low refractive index layer.

11. The OLED display of claim 10, wherein the capping layer further comprises a thickness adjustment layer between the first low refractive index layer and the second high refractive index layer.

12. The OLED display of claim 11, wherein a thickness of the thickness adjustment layer is less than or equal to a sum of thicknesses of the first high refractive index layer, the first low refractive index layer, the second high refractive index layer, and the second low refractive index layer.

13. The OLED display of claim 12, wherein a refractive index of the thickness adjustment layer is smaller than or equal to of the refractive index of the first high refractive index layer, and greater than or equal to that the refractive index of the second low refractive index layer.

14. The OLED display of claim 1, wherein
    the OLED comprises:
        a first electrode connected to the TFT;
        a light-emitting member on the first electrode; and
        a second electrode on the light-emitting member, and
    the capping layer is on the second electrode.

15. The OLED display of claim 14, wherein the light-emitting member comprises a plurality of light-emitting units.

16. The OLED display of claim 15, wherein each of the light-emitting units is configured to emit one of red light, blue light, green light, yellow light, and orange light.

17. The OLED display of claim 16, wherein
    the plurality of light-emitting units comprises three light-emitting units, and
    two of the three light-emitting units are configured to emit a same color light, and another of the three light-emitting units is configured to emit a different color light.

18. The OLED display of claim 16, wherein
    the plurality of light-emitting units comprises three light-emitting units, and
    the three light-emitting units are configured to emit different colors from each other.

* * * * *